United States Patent [19]

Sugisawa et al.

[11] Patent Number: 5,619,511
[45] Date of Patent: Apr. 8, 1997

[54] DYNAMIC SCAN CIRCUIT AND METHOD FOR USING THE SAME

[75] Inventors: Junji Sugisawa, Santa Clara; Dilip Lalwani, Sunnyvale, both of Calif.

[73] Assignee: Intel Corporation, Santa Clara, Calif.

[21] Appl. No.: 692,864

[22] Filed: Jul. 30, 1996

[51] Int. Cl.$^6$ ................................................. G06F 11/00
[52] U.S. Cl. ................................... 371/22.3; 395/183.06
[58] Field of Search .................................. 371/22.3, 22.1, 371/22.2, 22.5, 22.6, 27; 395/183.06; 324/158 R

[56] References Cited

U.S. PATENT DOCUMENTS

| 4,947,357 | 8/1990 | Stewart et al. | 371/22.3 |
| 5,068,603 | 11/1991 | Mahoney | 371/22.3 |

OTHER PUBLICATIONS

Dobberpuhl, et al., "A 200–MHz 64–b Dual–Issue CMOS Microprocessor", IEEE Journal of Solid–State Circuits, vol. 27, No. 11, Nov. 1992, pp. 1555–1565.

Levitt, et al., "Testability, Debuggability, and Manufacturability Features of the UltraSPARC™–I Microprocessor", International Test Conference, 1995, Paper 6.2, pp. 157–166.

Gerosa, et al., "A 2.2 W, 80 MHz Superscalar RISC Microprocessor", IEEE Journal of Solid–State Circuits, vol. 29, No. 12, Dec. 1994, pp. 1440–1454.

*Primary Examiner*—Vincent P. Canney
*Attorney, Agent, or Firm*—Blakely, Sokoloff, Taylor & Zafman

[57] ABSTRACT

The present disclosure describes a scan latch which utilizes dynamic interface nodes to facilitate full scan operation with a reduced number of transistors. A scan latch slave stage is coupled to a storage node of a storage device to capture data from that device. The scan latch slave device has an output driver with an input node coupled by a pass gate to the storage node. A scan clock line is coupled to the pass gate and to an enable input of the output driver. A slave scan clock signal received on the scan clock line enables the output driver and controls the pass gate. A master stage which may be utilized with the scan latch slave stage has a tri-state input device coupled to a serial input. The tri-state input device is controlled by a master scan clock and has an output coupled to the storage node.

20 Claims, 4 Drawing Sheets

DYNAMIC SCAN CIRCUIT AND METHOD FOR USING THE SAME

FIELD OF THE INVENTION

The present invention pertains to the field integrated circuit testing. More specifically, the present invention relates to scan latch circuits for reducing the overhead of scan-based design.

BACKGROUND

Integrated circuits (chips) relentlessly continue increasing in device count and complexity. While this ongoing progress births a myriad of new hardware and software capabilities, such expansion is not without cost. Burgeoning integrated circuit die sizes consume precious silicon real estate. Also, higher device counts and device densities made possible by technological advances result in greater power consumption per die, thus reducing battery lives and increasing heat dissipation problems.

Against such concerns for silicon real estate and chip power consumption, the enormous task of testing these complex integrated circuits must be weighed. Indeed, the problem of testing also grows with device complexity. Exhaustive testing of chips becomes intractable, if not outright impossible, where millions of internal nodes must be tested through only hundreds of interface nodes (pins). Additionally, new packaging techniques such as flip-chip mounting complicate probing and other specialized techniques for observing internal integrated circuit nodes in packaged and/or operational devices.

Consequently, it has long been recognized that increased visibility into the internal states of integrated circuits can provide a great boon to testing efforts. Various techniques of scanning logic values into and out of the core of an integrated circuit have been in use since at least the early 1970's (see, e.g., U.S. Pat. No. 3,761,695 entitled "Method of Level Sensitive Testing a Functional Logic System" by Eichelberger).

Prior art scan latches such as the one shown in FIG. 1 typically employ static design principles and consequently do not necessarily minimize the number of devices needed to provide the test capabilities of the illustrated design. The prior art scan circuit includes a master stage 100 and a slave stage 110, each having a connection to a storage node 105 driven by a data latch 115 during normal operation. Since the slave stage 110 drives a slave stage output node 120 at all times, regardless of the data origin or the clock states, the scan latch is considered a static scan latch.

Data from the data latch 115 represents data which passes through combinational logic circuits during normal operation of the chip. When a core clock signal (CLK) is high, the clock signal and an inverted clock signal generated by an inverter 130 cause data from a data input (DIN) to pass through a pass gate 125. During normal operation, scan clock A (SCA) is low, SCA# generated by an inverter 150 is high, and cross-coupled tri-state inverters 134 and 132 sustain the data when CLK falls. An inverter 136 drives the value to a subsequent combinational logic block CB 138 and to a latch 140.

In a test mode, data can be scanned in from a serial input (SI) when scan clock A is high. The tri-state inverter 134 is disabled and the storage node 105 is driven by an inverter 152 from the serial input through a pass gate 156. In another test mode, data can be scanned out from the storage node 105 when scan clock B (SCB) is driven high. A pass gate 162 is enabled when scan clock B is high and SCB#, generated by an inverter 160, is low. An inverter 166 and a tri-state inverter 164 sustain the data when SCB falls. Data is driven to the slave stage output node 120 by an inverter 168 and can be shifted out through a subsequent master stage 170 and other subsequent stages by alternating SCA and SCB.

Again, this prior art scan latch is a static scan latch because the inverter 168 continuously drives the slave stage output node 120. Such a static design results in the addition of twenty transistors per data latch, eighteen of which are included in the master and slave stages, with the two additional devices included in this case to make the inverter 134 in the data latch a tri-state inverter.

The prior art has clearly recognized the importance of scan based design. In light of the high device overhead of adding scan to a design, any reduction in scan cell size could greatly reduce costs where scan is employed extensively. Additionally, reducing power consumption in elements as pervasive as scan cells helps reduce the overhead associated with a scan based design. The prior art, however, has not adequately addressed these concerns. In particular, the prior art has failed to utilize dynamic scan latches to reduce device count in the scan latch slave.

SUMMARY

The present disclosure describes a scan latch which utilizes dynamic interface nodes to facilitate full scan operation with a reduced number of transistors. A scan latch slave stage is coupled to a storage node of a storage device to capture data from that device. The scan latch slave stage has an output driver with an input node coupled by a pass gate to the storage node. A scan clock line is coupled to the pass gate and to an enable input of the output driver. A slave scan clock signal received on the scan clock line enables the output driver and controls the pass gate.

A master stage which may be utilized with the scan latch slave stage has a tri-state input device coupled to a serial input. The tri-state input device is controlled by a master scan clock and has an output coupled to the storage node.

BRIEF DESCRIPTION OF THE FIGURES

The present invention is illustrated by way of example and not limitation in the figures of the accompanying drawings.

DETAILED DESCRIPTION

The present invention is a dynamic scan circuit. In the following description, numerous specific details such as particular latch and gate implementations, transistor types, and signal polarities are set forth in order to provide a more thorough understanding of the present invention. It will be appreciated, however, by one skilled in the art that the invention may be practiced without such specific details.

A scan latch of the present invention advantageously employs tri-state drivers and dynamic nodes to reduce gate count and power consumption. A scan latch of the present invention also only lightly loads data latch storage nodes and consequently has little impact on data latch timings. Thus, the present invention reduces the overhead of a scan based design, easing the cost of the internal node observation and control which is increasingly important as designs grow in complexity.

Designing dynamic logic presents several challenges since dynamic nodes are only driven at certain times. First, the dynamic node should be adequately charged or discharged during the limited period it is driven. Consequently, the driving transistor and driving period should be appropriately controlled so that subsequent logic recognizes the driven data values.

Additionally, dynamic nodes which are either uninitialized or not driven for an extended period of time may float at an intermediate voltage between the power supply values. If such an intermediate voltage is presented on the input of a logic gate such as an inverter, static current typically flows through a path created by partially enabled complementary transistors. The dynamic scan latch of the present invention overcomes these difficulties and provides a robust, area-saving design.

Figure 2:
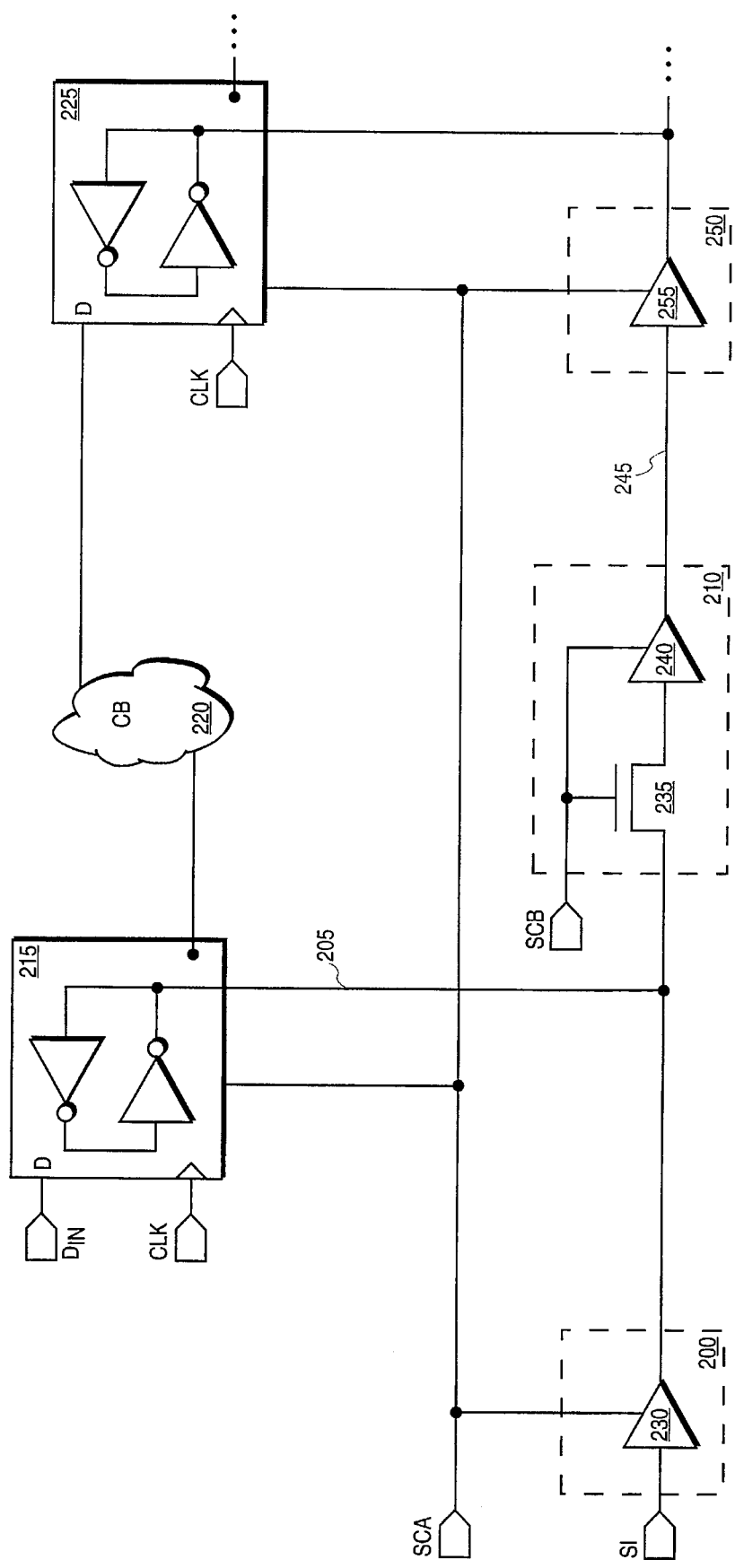
FIG. 2 is schematic diagram illustrating one embodiment of a dynamic scan latch of the present invention connected to a storage device.

FIG. 2 illustrates the basic components for implementing one embodiment of the dynamic scan latch. This circuit provides the capability to scan data in from a serial input (SI) through a master stage 200, over-riding a value captured during a core clock (CLK) cycle by a data latch 215. Additionally, the dynamic scan latch allows data to be captured from the data latch 215 by a slave stage 210. Data scanned in or scanned out is typically propagated through a plurality of scan cells via a serial input and a serial output for the entire scan chain.

The master stage 200 receives data from a serial input (SI) when data passes through the scan chain. When a first scan clock (SCA) is active, data scanned in from the serial input is driven to a storage node 205 by a tri-state input device 230. When SCA is inactive, the tri-state input device 230 is disabled, thus removing any static current paths despite any intermediate voltage values which may be present at the serial input. This arrangement allows the master stage to be connected to a floating input node such as a serial output of another dynamic scan latch.

The first scan clock (SCA) is also connected to the data latch 215 to avoid contention between the tri-state input device 230 and the data latch 215. The data latch 215 may be any type of data storage element which has a sustained node such as the storage node 205. As shown, a pair of cross-coupled inverters sustains data in the data latch 215; however, other storage elements such as master-slave flip-flops or domino latches may be used. An output from the data latch passes through a combinational block 220 and to another data latch 225 which also allows scan capabilities.

Data captured from the data input (DIN) may be scanned out of the data latch 215 via the slave stage 210 when a second scan clock (SCB) is active. In this case, the data from the storage node 205 is coupled through a pass gate 235 to an input node of a slave output driver 240. The slave output driver 240, also enabled by an active SCB, drives the data value to a serial output node 245 for the scan cell.

When SCB is inactive, the pass gate 235 isolates the slave output driver 240 from the storage node 205. Also when SCB is inactive, the slave output driver 240 is tri-stated. Since the serial output node 245 is coupled to a tri-state input device 255 (also controlled by SCA) in a subsequent master stage 250, no power consumption issues arise from the serial output node 245 floating. Typically, many such dynamic scan latches serially connect in this manner to form a scan chain traversing some or all of an integrated circuit. Such an arrangement allows observation and control of many internal nodes.

Figure 1:
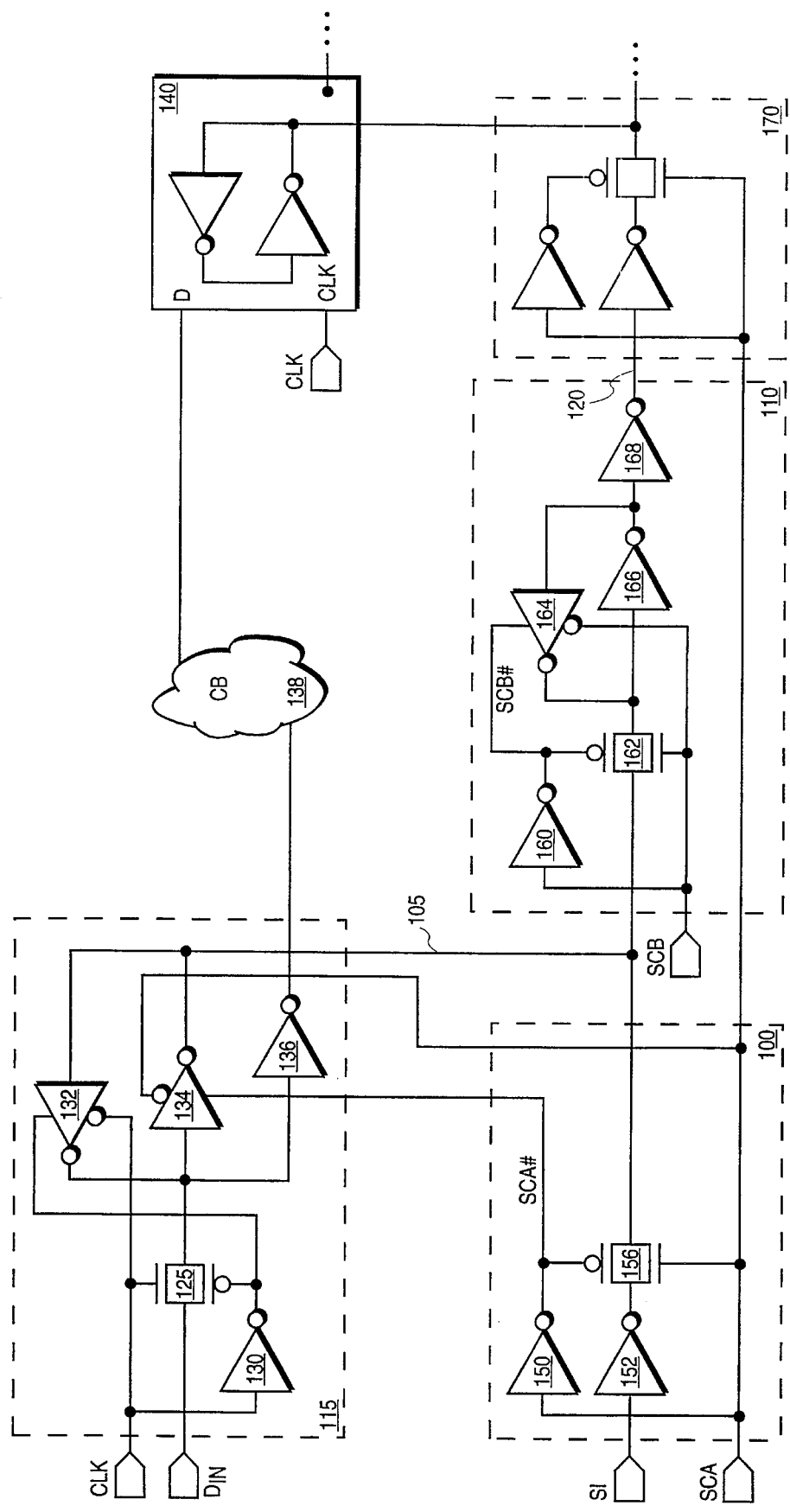
FIG. 1 is a schematic diagram showing a prior art scan latch connected to a storage device.
Figure 3:
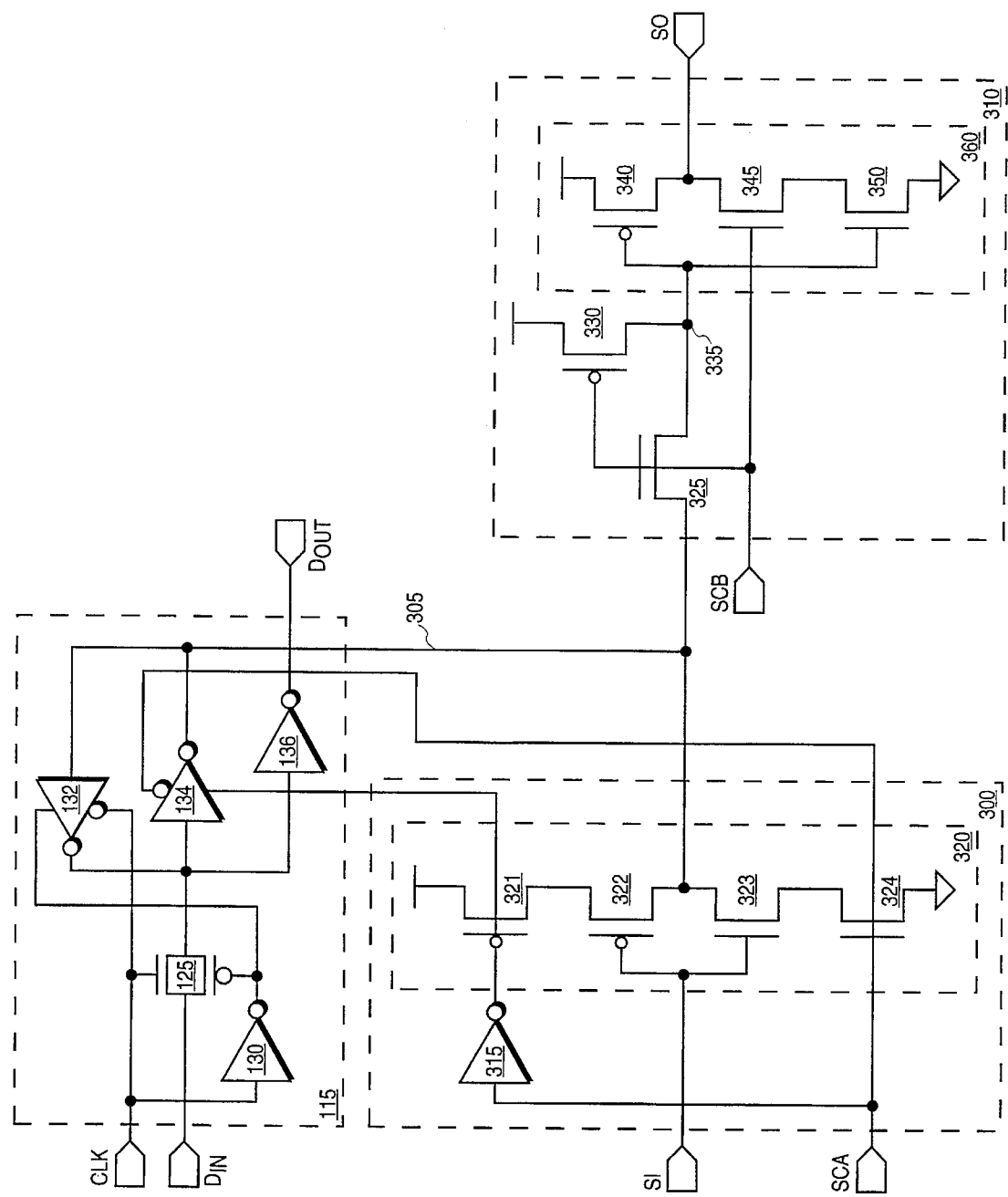
FIG. 3 illustrates a detailed schematic of one embodiment of the present invention.

FIG. 3 illustrates details of one embodiment of the dynamic scan latch which may be used in a dynamic scan chain. The data latch 115 illustrated is identical to that illustrated with the prior art scan latch of FIG. 1. In addition, this design provides test capabilities similar to the prior art because two scan clocks allow a storage node 305 to be driven by the data latch 115 or a scan latch master stage 300, and sampled by a scan latch slave stage 310. In this embodiment, the slave stage 310 includes only five transistors as opposed to the prior art slave stage 110 which requires twelve transistors. The total overhead of adding scan logic is thus reduced thirty-five percent from twenty transistors to thirteen transistors.

Instead of the pass gate 156 used in the prior art, the master stage 300 includes a tri-state input device 320. Four series transistors 321-324 coupled between a first and second power supply (respectively Vcc and Vss) form the tri-state input device 320. Transistors 321 and 324 respectively coupled to SCA and SCA# (generated by an inverter 315 from SCA) disable the tri-state input device 320 when SCA is inactive. Thus, transistors 322 and 323 are isolated from their respective power supply nodes when the tri-state input device 320 is disabled. As a result, no current flows if the serial input node floats to an intermediate voltage.

The slave stage 310 includes a pass gate 325 which couples the storage node 305 to an output driver input node 335. A pull-up transistor 330 couples the output driver input node 335 to Vcc. In this embodiment, the second scan clock (SCB) is an active high signal. Accordingly, the pass gate 325 is an N channel device which passes data from the storage node 305 when SCB is high. Also, the pull-up transistor 330 is a P channel transistor which charges the output driver input node 335 to Vcc when SCB is low.

The output driver 360 is formed by an output pull-up transistor 340 and a pair of output pull-down transistors 345 and 350. The output pull-up transistor 340 is a P channel transistor which selectably couples a serial output node (SO) to Vcc. The pair of pull-down transistors 345 and 350 form a series connection between the serial output node and Vss. Each of the pair of pull-down transistors is an N channel transistor, one of which (output pull-down transistor 345) is controlled by the second scan clock SCB. The other (output pull-down transistor 350) has a gate coupled to the output driver input node. An alternate design that reverses the gate connections of this series pair is within the scope of the present invention.

In some designs, it may be preferable to utilize active low clock signals. The master stage 300 could easily accommodate such a design choice at no additional expense by moving the inverter 315 to drive the opposite polarity enable input of the tri-state input device 320. Although at some cost in terms of devices, the slave stage may also be altered to accommodate active low clock signals.

Figure 4A:
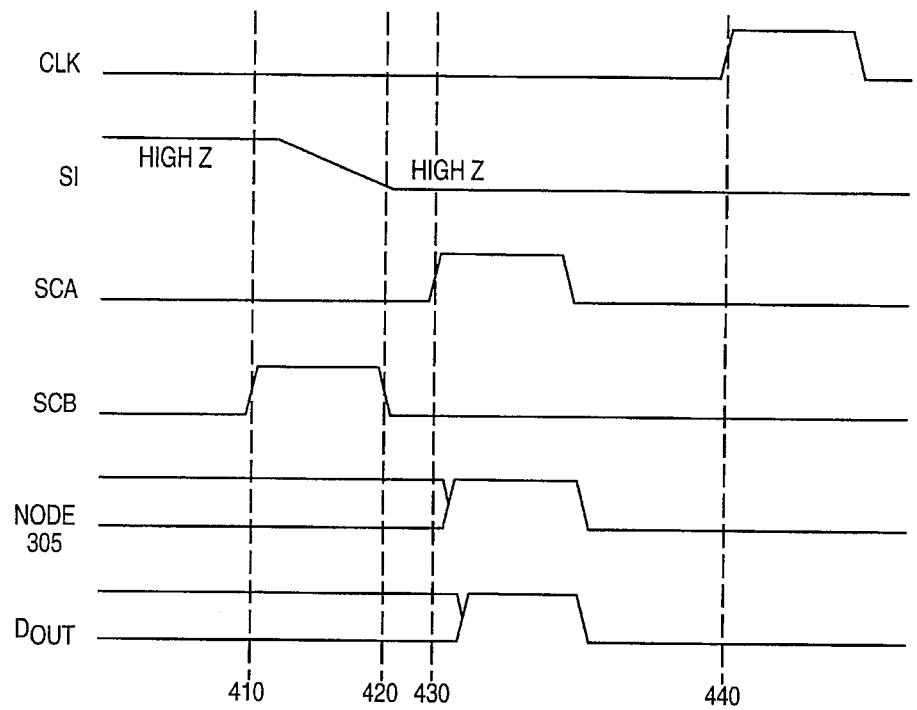
FIG. 4a is a timing diagram illustrating a scan-in operation performed using the scan latch of FIG. 3.

A scan-in operation performed by the dynamic scan circuit of FIG. 3 is illustrated in the timing diagram of FIG. 4A. During scan operations, the core clock signal (CLK) is held inactive (low). Prior to marker 410, when both SCA and SCB are inactive, SI is tri-stated ("HIGH Z") because both the output pull-up transistor and the output pull-down transistor in a previous scan latch driving SI are turned off. This tri-stating also occurs in the slave stage 310 of the illustrated scan latch. The output pull-up transistor 340 is turned off because the output driver input node 335 is isolated from the storage node 305 by the pass gate 325 and charged up to Vcc by the pull-up transistor 330. The output pulldown transistor 345 is turned off because of its direct connection to the inactive SCB.

The timing diagram of FIG. 4A illustrates a waveform for the serial input node indicating that it is driven by a previous scan cell which contains a low logic level. Thus, at marker 410 when SCB rises, SI is driven from the HIGH Z state to reflect the data from this previous cell. The slave stage of the previous cell, being identical to the slave stage 310, drives SI until marker 420 where SCB becomes inactive, at which point the serial input node is left to dynamically hold the driven data.

The dynamic nature of the slave stage output dictates several important design considerations for the scan latch. With a prior art static scan latch, the output is continually driven, thus the serial input transition (driven from the prior serial output) need not complete prior to the end of the SCB clock pulse. On the other hand, the dynamic scan latch must drive the serial output node to an acceptable logic level (i.e. one which may be properly sampled by the next master stage) by the time SCB falls since the prior slave output driver is disabled at that time. Consequently, the output driver must be large enough to charge or discharge the full interconnect between scan cells during the active phase of SCB. Either device sizing in the slave stage or clock width can be adjusted to accommodate this need.

In some instances, the routing between scan cells may exceed the design capacity of the scan cell. In this case, an inverter or buffer is typically used as a repeater to drive the value to the next scan cell. With a dynamic scan chain, a simple repeater no longer suffices. Instead, a sustainer (e.g., a pair of cross-coupled inverters) sustains the long interconnect to prevent an intermediate voltage from drawing current through repeaters. When repeaters are necessary, the dynamic nature of that particular interconnect section is lost and the device savings are reduced.

Where no repeaters are used, the fall of SCB at marker 420 causes SI to return to HIGH Z. Except as degraded by charge leakage, the interface node holds the low logic level sampled from the previous scan latch. With the rise of SCA at marker 430, the tri-state input device inverts this low logic level and drives the storage node 305. The rise of SCA also disables the tri-state inverter 134 to avoid contention on the storage node 305. An alternate design could replace the tri-state inverter with a continually enabled inverter (saving two devices) as long as the tri-state input device 320 is properly sized to flip the storage node 305.

The scanned in data propagates from the storage node 305 to the data latch output (DOUT) since the CLK signal is low and the inverter 136 is continuously enabled. At this point, the scan-in process has set the state of the data latch 115. By serially shifting values into a large number of data latches, the entire state of the integrated circuit may be controlled. Thus, execution ensues from a controlled starting point as CLK is once again activated at marker 440.

Figure 4B:
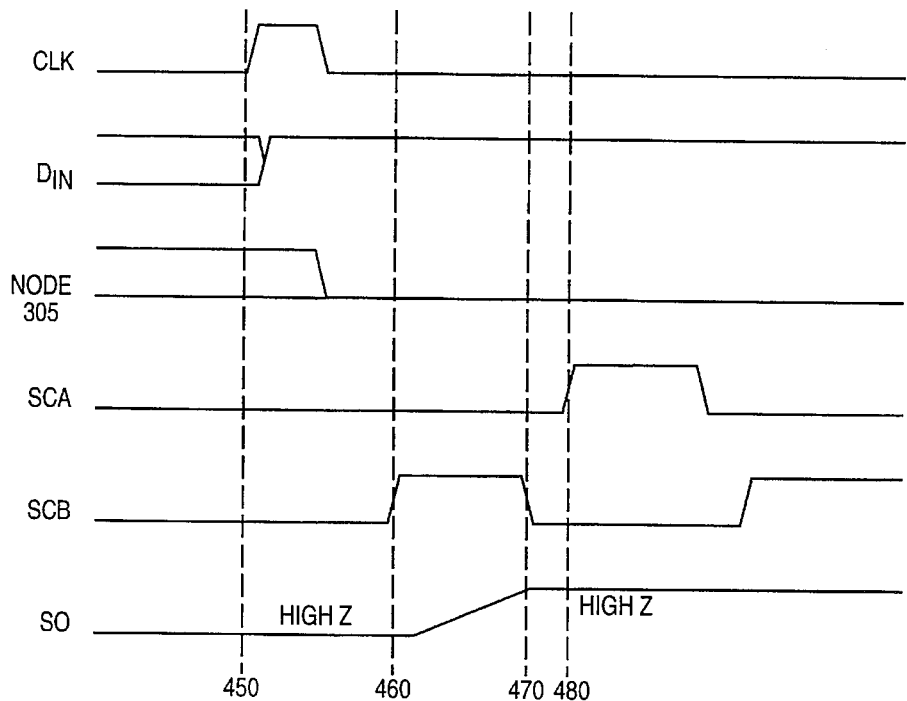
FIG. 4b is a tinting diagram illustrating a scan-out operation performed using the scan latch of FIG. 3.

In addition to providing control of the internal state of an integrated circuit, the scan circuit allows observation of the status of all connected storage nodes. A scan-out sequence allowing such observation is illustrated in FIG. 4B. A final cycle of the core clock prior to scan operation is shown at marker 450. With this core clock, data (e.g. a high logic level) is latched in the data latch 115 as occurs during normal operation.

During such normal operation, the scan latch shown in FIG. 3 advantageously only minimally loads the data latch 115. Since the pass gate 325 is disabled, only the diffusion capacitance of the pass gate 325 and the diffusion capacitances of the output drivers of the tri-state input device 320 load the storage node. Thus, this configuration does not load the storage node 305 with any gate capacitances which could impact performance of the data latch 115.

Prior to the rise of SCB at marker 460, the serial output signal (SO) is tri-stated. While the SCB signal is low, the pass gate 325 isolates the output driver input node 335 from the storage node 305 the pull-up 330 charges the output driver input node 335 to Vcc thereby applying a disabling voltage to the output pull-up transistor 340. Since SCB is inactive and connected to the gate of the pull-down transistor 345, the pull-down transistor 350 is isolated from the serial output and accordingly unable to drive SO.

When SCB rises, the pull-up transistor 330 ceases pulling the output driver input node 335 to Vcc, this node instead being driven to the value on the storage node 305 through the pass gate 325. Since SCB is now high, the output driver pull-down transistor 345 is now enabled, allowing the output driver 360 to drive the inverse of the value at the output driver input node 335 to the serial output. In the illustrated example the high logic level initially received from the data input of the data latch 115 is driven on the serial output during the active phase of SCB.

At marker 470, SCB falls and the output driver 360 ceases driving SO. As previously discussed, the driver size and scan clock pulse duration must ensure that SO is driven to an appropriate voltage level before tri-stated. At marker 480, SCA rises thus allowing the value captured from the data latch 115 to propagate to the master stage of a subsequent scan latch. By alternating SCA and SCB, many captured data values may be serially shifted through a single scan chain serial output and easily observed during testing of the integrated circuit.

Thus, the present invention provides a low device count dynamic scan circuit useful in testing integrated circuits. While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art upon studying this disclosure.

What is claimed is:

1. A scan latch slave stage coupled to a storage node of a storage device, the scan latch slave stage comprising:

a tri-state output driver having an output driver input node and having an enable input coupled to a scan clock line;

a pass gate coupling the storage node to the output driver input node, the pass gate being controlled by the scan clock line.

2. The scan latch slave stage of claim 1 further comprising:

a pull-up transistor coupling the output driver input node to a first power supply node, the pull-up transistor having a control input coupled to the scan clock line.

3. The scan latch slave stage of claim 2 wherein the tri-state output driver comprises:

an output pull-up transistor coupling a scan latch output to the first power supply node, the output pull-up transistor having an output pull-up control input coupled to the output driver input node;

a pair of output pull-down transistors coupling the scan latch output to a second power supply node, one of the output pull-down transistors having a first pull-down transistor control input coupled to the scan clock line, the other of the output pull-down transistors having a second pull-down transistor control input coupled to the output driver input node.

4. The scan latch slave stage of claim 3 wherein the scan latch output is coupled to a next scan latch having a tri-state input stage.

5. A scan latch coupled to a storage node of a storage device, the scan latch comprising:

a master stage having a tri-state input device coupled to a scan latch input, the tri-state input device being controlled by a first scan clock and having a tri-state output coupled to the storage node;

a slave stage comprising:
an output driver having an output driver input node, the output driver being coupled to tri-state a scan latch output when a second scan clock is inactive;
a pass gate coupling the storage node to the output driver input node, the pass gate being controlled by the second scan clock.

6. The scan latch of claim 5 wherein the output driver is coupled to drive a value from the output driver input node to the scan latch output when the second scan clock is active.

7. The scan latch of claim 6 wherein the slave stage further comprises:

a pull-up transistor coupling the output driver input node to a power supply node, the pull-up transistor having a pull-up control input coupled to enable the pull-up transistor when the second scan clock is inactive.

8. The scan latch of claim 7 wherein the pull-up transistor is a P channel transistor and the second scan clock is an active high signal.

9. The scan latch of claim 6 wherein the output driver comprises:

an output pull-up transistor coupling the scan latch output to a power supply node, the output pull-up transistor having an output pull-up control input coupled to the output driver input node;

a pair of output pull-down transistors coupling the scan latch output to a second power supply node, one of the output pull-down transistors having a first pull-down transistor control input coupled to receive the second scan clock, the other of the output pull-down transistors having a second pull-down transistor control input coupled to the output driver input node.

10. The scan latch of claim 9 wherein the output pull-up transistor is a P channel transistor and each of the pair of output pull-down transistors is an N channel transistor.

11. An integrated circuit comprising:

a first data latch having a first storage node;

a scan latch slave stage receivingly coupled to the first storage node and having a tri-state output node; and a scan latch master stage having a tri-state input device coupled to the tri-state output node.

12. The integrated circuit of claim 11 wherein the scan latch slave stage is coupled to receive a first scan clock signal, the scan latch slave stage capturing data from the first storage node and driving the tri-state output node when the first scan clock is active.

13. The integrated circuit of claim 12 further comprising:

a second data latch having a second storage node coupled to an output of the scan latch master stage, wherein the scan latch master stage is coupled to receive a second scan clock signal, the scan latch master stage driving a value from the tri-state output node to the second storage node when the second scan clock signal is active.

14. A method of providing scan capabilities for a storage device having a storage node, the method comprising the steps of:

(a) if a slave scan clock is inactive, then
(i) isolating the storage node from an output driver input node of an output driver, and
(ii) tri-stating a serial output node of the output driver; and (b) if the slave scan clock is active, then passing a stored value from the storage node to the output driver.

15. The method of claim 14 wherein step (a)(ii) further comprises the steps of:

(A) applying a disabling logic level to a serial output pull-up transistor;

(B) isolating the serial output node from a pull-down voltage supply.

16. The method of claim 15 wherein step (a)(ii)(A) further comprises the step of:

charging the output driver input node to the disabling logic level.

17. The method of claim 16 wherein the step (a)(ii)(B) further comprises the step of:

applying the slave scan clock to one of a pair of transistors coupling the serial output node to the pull-down voltage supply.

18. A method of providing serial scan in and scan out for a storage device having a storage node, the method comprising the steps of:

(a) tri-stating an input device if a first scan clock is inactive;

(b) driving, using the input device, the storage node to a serial input value if the first scan clock is active;

(c) tri-stating an output driver if a second scan clock is active;

(d) passing a stored value from the storage node to the output driver if the second scan clock is inactive.

19. The method of claim 18 wherein step (c) further comprises the steps of:

(i) isolating the storage node from an output driver input node of the output driver;

(ii) charging the output driver input node to a first logic level.

20. The method of claim 19 further comprising the step of:

(c)(iii) disabling an output pull-down transistor.

* * * * *

UNITED STATES PATENT AND TRADEMARK OFFICE
CERTIFICATE OF CORRECTION

| | | |
|---|---|---|
| PATENT NO. | : | 5,619,511 |
| DATED | : | April 8, 1997 |
| INVENTOR(S) | : | Sugisawa et al. |

It is certified that error appears in the above-identified patent and that said Letters Patent is hereby corrected as shown below:

In column 2 at line 58 delete "tinting" and insert --timing--

Signed and Sealed this

Twenty-second Day of July, 1997

Attest:

Attesting Officer

BRUCE LEHMAN

Commissioner of Patents and Trademarks